United States Patent [19]
Welch et al.

[11] Patent Number: 5,185,752
[45] Date of Patent: Feb. 9, 1993

[54] COUPLING ARRANGEMENTS FOR FREQUENCY-DOUBLED DIODE LASERS

[75] Inventors: David F. Welch, San Jose; Robert G. Waarts, Palo Alto, both of Calif.

[73] Assignee: Spectra Diode Laboratories, Inc., San Jose, Calif.

[21] Appl. No.: 837,819

[22] Filed: Feb. 18, 1992

[51] Int. Cl.⁵ .............................................. H01S 3/10
[52] U.S. Cl. ...................................... 372/22; 372/96; 372/102; 359/328
[58] Field of Search ............................ 372/22, 96, 102; 359/328

[56] References Cited

U.S. PATENT DOCUMENTS

| | | | |
|---|---|---|---|
| 4,925,811 | 5/1990 | Menigaux et al. | 437/129 |
| 4,951,293 | 8/1990 | Yamamoto et al. | 372/50 |
| 4,953,931 | 9/1990 | Miyazaki et al. | 350/96.12 |
| 4,953,943 | 9/1990 | Miyazaki et al. | 350/96.12 |
| 4,955,030 | 9/1990 | Menigaux et al. | 372/44 |
| 4,973,117 | 11/1990 | Yamada | 350/96.12 |
| 5,022,729 | 6/1991 | Tamada et al. | 350/96.12 |
| 5,036,220 | 7/1991 | Byer et al. | 307/427 |
| 5,039,627 | 8/1991 | Menigaux et al. | 437/129 |
| 5,121,250 | 6/1992 | Shinozaki et al. | 359/328 |

OTHER PUBLICATIONS

D. Welch et al., "Low Threshold Current Laser Emitting At 637nm" Electronics Letters, vol. 27, No. 9, pp. 693–694 (1991).

*Primary Examiner*—Léon Scott, Jr.
*Attorney, Agent, or Firm*—Schneck & McHugh

[57] ABSTRACT

Arrangements for efficiently coupling light between a laser diode and a second-harmonic generator which feature external resonant cavities that include a feedback grating fabricated on the second-harmonic generator. The feedback grating reflects light of a first frequency that matches the frequency doubling band of the second-harmonic generator, thereby establishing stable laser oscillation at that first frequency. Preferably, the second-harmonic generator has a periodically-poled waveguide formed in the surface of the nonlinear material body. The laser diode may be butted against the harmonic generator or coupling optics may be positioned between the two. In one arrangement, a polarizer is placed in the resonant cavity, either between an external back reflector and the back facet of the laser diode or between the antireflection coated front facet of the laser diode and the harmonic generator, to provide loss to the TE polarization mode and enhance oscillation in the TM polarization mode. In another arrangement, a half-wave plate is positioned between the antireflection coated front facet of the laser diode and the input end of the harmonic generator to cause TE mode oscillation in the laser diode, while coupling TM polarized light into the harmonic generator. The laser diode may be a monolithic laser diode array with multiple emitters, with the second-harmonic generator having multiple waveguides for receiving and doubling the frequency of light received from a corresponding diode emitter. The diode array may be a multiple wavelength array.

22 Claims, 4 Drawing Sheets

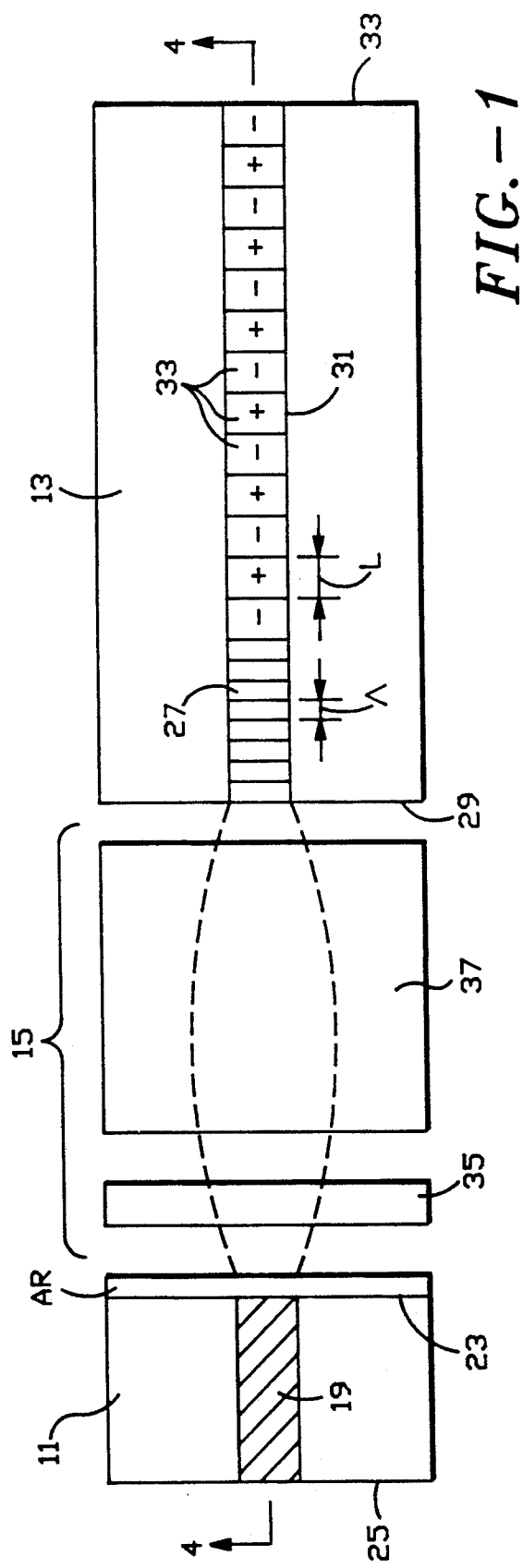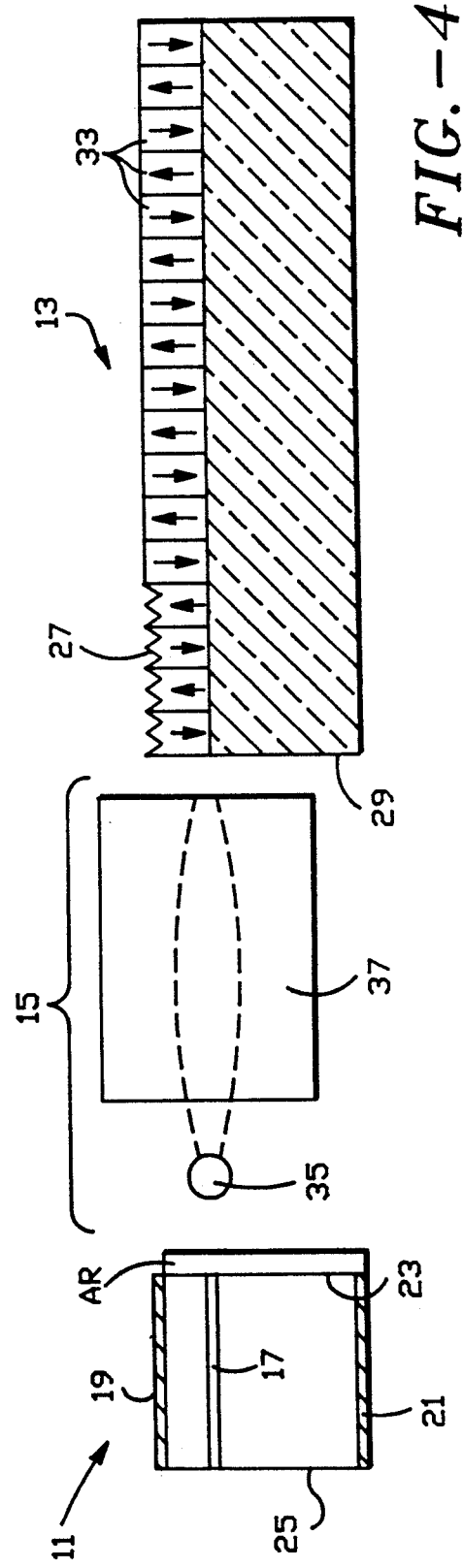

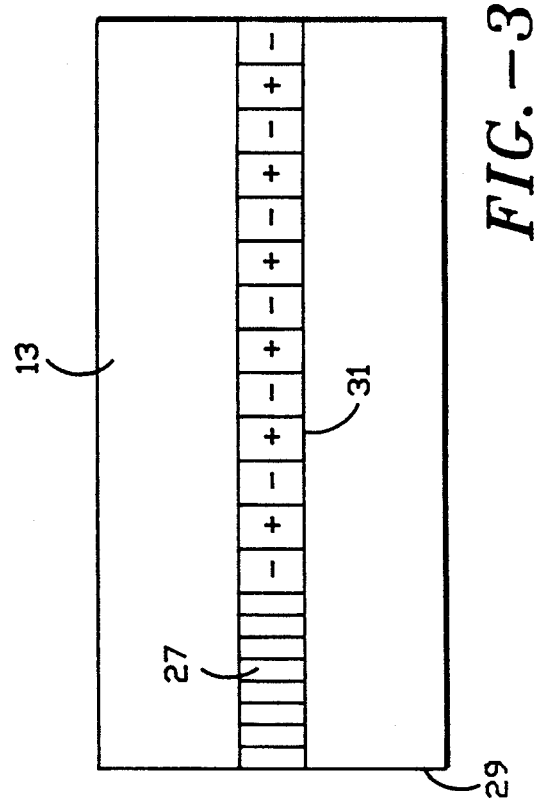
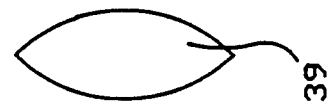
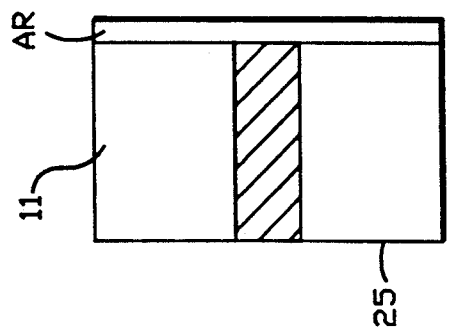
FIG.-2
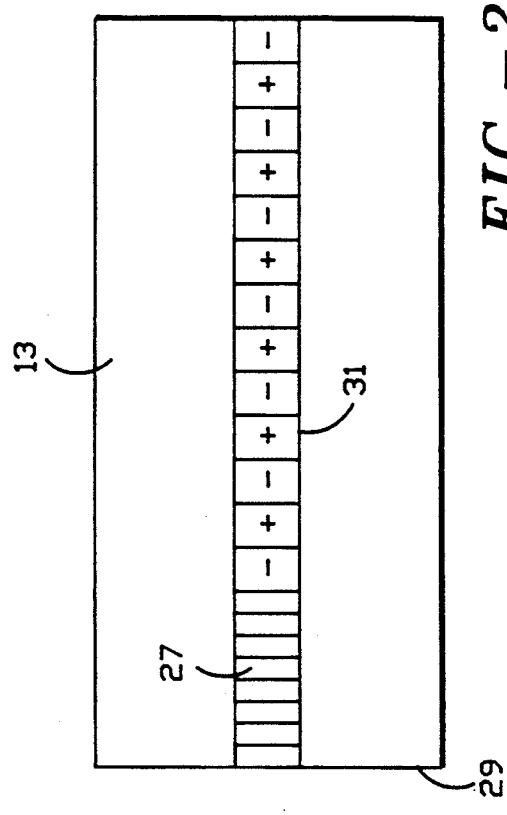
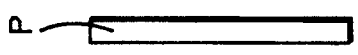
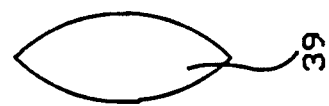
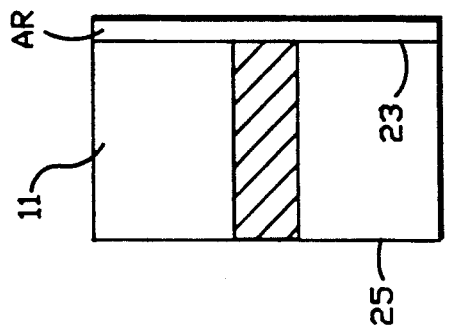
FIG.-3

COUPLING ARRANGEMENTS FOR FREQUENCY-DOUBLED DIODE LASERS

TECHNICAL FIELD

The present invention relates to frequency-doubled diode lasers having a semiconductor laser diode optically coupled to a second-harmonic generator.

BACKGROUND ART

Frequency-doubled diode lasers have been demonstrated. One example of such a device is the laser apparatus described in U.S. Pat. No. 4,951,293 to Yamamoto et al. In that patent, a semiconductor laser and an optical nonlinear device are both located on a submount, with the laser's active layer and the nonlinear device's surface waveguide facing the submount, so that a fundamental light wave from the laser can be directly applied to the nonlinear device and doubled in frequency, thereby providing a visible light output from the nonlinear device.

Second harmonic generators are well known nonlinear optical devices, and are commercially available. For example, U.S. Pat. Nos. 4,953,931 and 4,953,943 to Miyazaka et al. describe devices having a $LiNbO_3$ thin film waveguide layer formed on a $LiTaO_3$ substrate, which materials are formulated to have specified refractive indices at the fundamental and second harmonic wavelengths satisfying a desired relationship for efficient second-harmonic generation and waveguiding. U.S. Pat. No. 4,973,117 to Yamada describes a device that has a ridge type optical waveguide formed on a substrate of nonlinear optical material so as to generate a second-harmonic wave by Cerenkov radiation. This ridge type waveguide includes a first waveguide passage for confining a fundamental wave and converting it into the second-harmonic wave and a second waveguide passage for confining the second-harmonic wave and propagating it toward an end face for emission thereof. The first waveguide passage, which is formed so as to be in contact on at least one of the lateral side surfaces of the ridge-shaped second waveguide passage, has a width dimension that is smaller than the cutoff thickness for propagation of the second-harmonic wave so as to leak this radiation into the second waveguide passage.

In U.S. Pat. No. 5,022,729, Tamada et al. describe an optical waveguide and second-harmonic generator having a $Ta_2O_5$ $TiO_2$-system amorphous thin film optical waveguide formed on a substrate for confining and guiding lightwaves received thereby. The substrate may be a nonlinear optical crystal material, so that a second-harmonic wave can be obtained from the fundamental wave received by the waveguide and then radiated to the substrate side. Generation of visible (0.4 $\mu$m) second-harmonic wave light from the near infrared (0.8 $\mu$m) fundamental wave light of a semiconductor laser can be made more efficient by forming a periodically-poled region of selected period and depth in the nonlinear material substrate.

In U.S. Pat. No. 5,036,220, Byer et al. describe a nonlinear optical converter having a source of electromagnetic radiation of a frequency different than the desired optical frequency, a solid state material body provided with a waveguide, and means for directing the electromagnetic radiation from the source into the waveguide. The waveguide is characterized by being provided with a plurality of successive regions of differing compositions, such that successive regions form domains of alternating dominant electrical polarization states. The electrical polarization states are aligned transverse to the path of the guided radiation. The resulting waveguide converts the frequency of the radiation received from the source to a desired optical frequency for the output radiation.

By coupling single-mode diode lasers to periodically-poled waveguides, output powers for the frequency-doubled laser light in excess of 0.5 mW cw have been demonstrated. The output power of frequency-doubled diode lasers is limited by the stability of the diode laser's output wavelength, which must be matched to the peak frequency-conversion wavelength of the periodically-poled waveguide for maximum conversion efficiency, and is also limited by the coupling efficiency of the diode laser light to the periodically-poled waveguides.

It is an object of the invention to provide higher power, frequency-doubled, diode lasers.

DISCLOSURE OF THE INVENTION

The above object has been met with more efficient arrangements for optically coupling a laser diode to a second-harmonic generator, which feature external resonant cavities in which optical feedback to the laser diode is supplied through a feedback grating formed on the harmonic generator itself. Supplying the feedback from the harmonic generator allows the laser diode to be less sensitive to the residual reflectivities that could otherwise occur anyway. The feedback grating stabilizes the laser diode output at a wavelength matched to the frequency-doubling bandwidth of the periodically-poled waveguide that preferably makes up the second-harmonic generator. The laser diode could be a laser diode array with plural laterally spaced diode emitters. The harmonic generator would then have multiple waveguides, each receiving the light from a corresponding diode emitter and doubling the light frequency. The laser diode array could be a multi-wavelength array with the fundamental frequencies determined by the feedback gratings in the harmonic generator.

The provision of an external resonant cavity also allows arrangements that more efficiently provide TM mode laser light to the periodically-poled waveguides. Typically, diode lasers radiate in a TE polarization mode. However, poled waveguides are most easily fabricated such that the nonlinear material's c-axis is oriented normal to the waveguide, and therefore usually require the input beam to be TM polarized. In one arrangement of the present invention, a polarizer is placed in the external cavity of the laser to introduce loss to the TE polarization mode. The laser diode is thereby made to operate in the TM mode. A laser diode could be made that operates in the TM mode without the need for a polarizer in the external cavity. In another coupling arrangement, the external cavity incorporates a half-wave plate to rotate the polarization of the light beam emitted from the diode. The laser diode can then use the high gain of the TE polarization mode, while still coupling a TM mode into the poled waveguide. Yet another arrangement places a TM polarizer between the laser diode and an external back reflector. This works in the same manner as placing the polarizer between the front of the laser diode and the poled waveguide.

These three arrangements provide TM polarization coupling to the poled waveguide, while maintaining the 3:1 aspect ratio of the laser diode. The diode can thus be butted to a poled waveguide with a matching 3:1 aspect ratio for straightforward alignment. Lenses could also be placed in the external cavity to match the diode light to a poled waveguide with a 1:1 aspect ratio.

BRIEF DESCRIPTION OF THE DRAWINGS

FIG. 1 is a top plan view of a first frequency-doubled diode laser arrangement of the present invention.

FIG. 2 is a top plan view of a second frequency-doubled diode laser arrangement of the present invention.

FIG. 3 is a top plan view of a third frequency-doubled diode laser arrangement of the present invention.

FIG. 4 is a side sectional view of the arrangement in any of FIGS. 1-3, taken along the line 4—4 in FIG. 1.

BEST MODE FOR CARRYING OUT THE INVENTION

Figure 5:
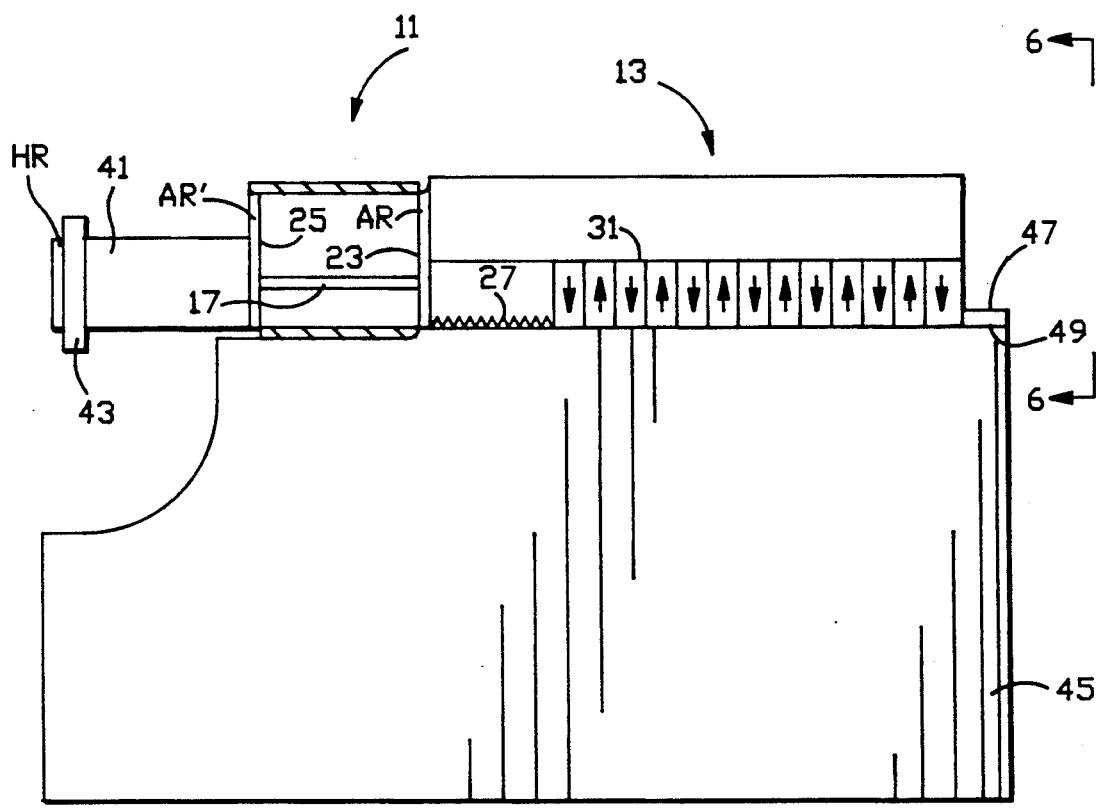
FIG. 5 is a side elevational view of a fourth frequency-doubled diode laser arrangement of the present invention.

With reference to FIG. 1, a frequency-doubled diode laser arrangement of the present invention includes a single-mode laser diode 11 which is optically coupled to a second-harmonic generator 13. Beam shaping and focusing optics 15 may be positioned between the laser diode 11 and the harmonic generator 13 for imaging the light output from the laser diode 11 onto the entrance aperture of the harmonic generator 13. Alternatively, the harmonic generator 13 may be butted to the laser diode 11, as seen in FIG. 5.

Laser diode 11 may be any of the single-mode laser diodes which are known in the art. As is well known, such laser diodes have a semiconductor body with an active light emitting region 17 near a pn junction in the body, as seen in FIG. 4, and with electrodes 19 and 21 on top and bottom surfaces for providing a forward electrical bias across the pn junction and injecting electrical current through the active light emitting region 17. As is well known, the semiconductor body of single mode laser diodes is preferably formed with a double heterostructure to efficiently confine light generation and propagation to the active region, and are also formed with a gain-guided geometry, a real-refractive-index geometry or both to laterally confine the light to a narrow stripe region. For example, the laser diode 11 in FIG. 1 is seen to have a narrow contact stripe top electrode 19 for providing gain guiding. The active region 17 may be a single active layer, a single quantum well structure or a multiple quantum well structure. Strained-layer superlattice structures can be used. The material composition of the laser diode body is typically some combination of III-V compound semiconductors, such as GaAs/AlGaAs, GaAs/InGaP, InGaAs/AlGaAs, InP/InGaAsP, etc., but other direct bandgap semiconductor materials may also be used. The semiconductor layers that make up the laser diode body may be formed using metal-organic chemical vapor deposition (MOCVD) or other well known single crystal growth techniques, together with photolithographic etching, diffusion and ion implantation techniques known in the art. Both the laser diode structures and the methods for making them are well established.

In the present invention, an external laser cavity is employed for at least the light emitting front end of the laser diode 11. Accordingly, a low reflection or antireflection coating AR is formed on the front facet 23. The back facet 25 of the laser diode 11 is typically a reflective facet, and may include a high reflection coating, if needed. Alternatively, the back end of the laser diode may also have an external cavity reflector HR, as seen in FIG. 5. Feedback to the front end 23 of the laser diode 11 is the result of a distributed Bragg reflector (DBR) grating 27 fabricated on the surface of the harmonic generator 13. The grating 27 together with the back reflector 25 of the laser diode 11 form a resonant optical cavity in which laser oscillation can occur at a frequency determined by the pitch of the grating 27. The grating 27 stabilizes the laser at a wavelength which is matched to the frequency doubling bandwidth of the harmonic generator 13. Supplying optical feedback from the harmonic generator 13 allows the laser diode 11 to be less sensitive to residual back reflections that ordinarily occur anyway off of the front face 29 of the harmonic generator 13. Harmonic generators are commercially available. A harmonic generator 13 with a frequency doubling bandwidth overlapping the gain bandwidth of the laser diode 11 can be purchased, and a DBR grating 27 can then be photolithographically patterned and etched into the harmonic generator's surface. Because of the low refractive indices of harmonic generator materials, the grating 27 can be a first order grating, which is generally more efficient at reflecting light than the second order gratings sometimes used in laser diode structures.

The preferred harmonic generator 13 is a periodically-poled frequency-doubling waveguide device. This type of harmonic generator 13 is also commercially available, again without the DBR grating 27 used in the present invention. These harmonic generators are formed from a nonlinear material, such as a ferroelectric crystalline body of $LiNbO_3$, $LiTaO_3$ or KTP. The "c-axis" of the crystal is generally oriented perpendicular to the top major surface of the body in which the waveguide will be formed, and thus also perpendicular to that waveguide 31.

The waveguide 31, in the form of a central channel in the top major surface of the body extending along the length of the body from front end 29 to exit end 33, is made by the exchange of protons ($H^+$) with lithium ions in the $LiNbO_3$ or $LiTaO_3$ material. The waveguide can also be fabricated by the diffusion of barium into KTP crystals. For example, the proton exchange may be performed by immersing the crystal in a weak, non-etching acid, such as benzoic acid, at an elevated temperature of 200° C., using a photolithographically-defined mask with a central stripe opening corresponding to the desired channel location to limit contact of the acid to the stripe region of the surface. The resulting diffusion of protons ($H^+$) increases the refractive index of the material slightly, creating a waveguide 31. For example, in the aforementioned U.S. Pat. No. 5,036,220 to Byer et al., a refractive index increase of 0.003 is obtained. The proton exchanged waveguide also has a slightly reduced nonlinear coefficient, so that an optimum balance is reached when the $H^+$ concentration is sufficiently high to create a waveguide that will maintain the received light intensity from the diode output, yet not so high that the nonlinear coefficient needed to provide efficient frequency doubling is significantly reduced. A 5-10% conversion efficiency is typical for the refractive index increase obtained by Byer et al. Other types of waveguides, such as the ridge type waveguide in the aforementioned U.S. Pat. No. 4,973,117 to Yamada can also be used. The waveguide 31 is a single transverse mode waveguide, at least at the fundamental frequency of light received from the laser diode 11.

In order to form the ferroelectric polarization domains of a periodically-poled waveguide, electrodes are patterned on the surface of the body 13, at least in areas that will interact with light propagating in the waveguide 31. For example, the electrodes may be formed above the waveguide channel region 31 or immediately adjacent the sides of the waveguide 31 or both. They may even extend laterally across the entire width of the body 13. However, only the areas that will interact with the light from the laser diode 11 are significant. An electric field is applied by the electrodes to the ferroelectric crystal body 13, with the electrodes alternating spatially between more positive and more negative potentials, while the temperature of the body 13 is raised above the Curie temperature. Heating the body to 500°-600° C. is typical. This orients the molecules of the crystal lattice so that regions or domains 33 of alternating dominant polarizations are obtained. The body 13 is cooled below the Curie temperature of the material while the electrode bias is maintained. An electrode pattern that couples opposing fields in adjacent regions 33 is preferred over simple on-off fields in order to minimize any uncertainty in the domain boundaries. The polarizations of the various domains 33 in FIGS. 1-5 are represented by "+" and "−" signs in the plan views and up and down arrows in the side views. The polarizations can extend laterally outside of the waveguide 31. The domains 33 have lengths L selected to provide either birefringent phasematching, first-order quasi-phasematching or third-order quasi-phasematching for the desired nonlinear coefficient and wavelength, as discussed in the aforementioned Byer et al. patent. These lengths L are related to the coherence length between free and forced second-harmonic waves resulting from the refractive index difference between the fundamental and free second-harmonic waves propagating in the waveguide 31. A domain length L on the order of 2-5 μm is typical.

The DBR grating 27 is formed by holographically exposing and selectively removing a mask, then etching the exposed portions of the top major surface of the body 13 over at least the front end of the waveguide 31. The grating period Λ is selected to reflect a desired fundamental wave back toward the laser diode 11. A first-order grating is preferred. The grating 27 can be formed over periodically-poled regions 33 of the waveguide 31. This will typically be the case when etching a grating 27 onto a commercially obtained second-harmonic generator 13. Alternatively, the regions of the waveguide 31 containing the grating 27 and periodically-poled domains 33 may be distinct, with no alternating domain polarizations under the grating 27. The use of the distributed Bragg reflector grating 27 selects the wavelength of the laser diode output beam and stabilizes the output at a wavelength that preferably matches the peak frequency-conversion efficiency of the harmonic generator 13.

Regardless of whether the harmonic generator 13 is obtained commercially and etched to form a grating, or made in-house, the manner in which the material is polarized dictates that the laser diode output beam be TM polarized when coupled through the front facet 29 into the harmonic generator 13 in order for the nonlinear interaction to be optimized. Typically, diode lasers operate most efficiently in the TE mode. A harmonic generator 13 could be made with its c-axis directed laterally parallel to the top major surface, and with alternating ferroelectric polarization domains still directed parallel to the c-axis, but such a generator 13 is more difficult to make. Alternatively, the harmonic generator 13 can be turned 90° onto the side, but this requires more complex beam shaping optics 15 to match the aspect ratio of the laser diode output beam (typically about 3:1) with the input face 29 of the waveguide 31. A 3 μm×3 μm waveguide 31 (aspect ratio 1:1) can be matched to a 3 μm×1 μm beam waist (aspect ratio 3:1) of the laser diode 11 through the use of beam shaping optics 15. In FIGS. 1 and 4, the beam shaping optics 15 includes a cylinder fiber lens 35 that nearly collimates the transverse direction of the beam while leaving the lateral direction essentially unaffected. This changes the beam aspect ratio from 3:1 to 1:1. The optics 15 also includes a graded-index (GRIN) lens 37, typically with a 0.45 pitch, to focus the light into the 3 μm×3 μm waveguide 31 of the harmonic generator 13. The cylinder fiber lens 35 can be positioned in proximity to the laser diode's antireflection coating AR on its output facet 23, while the GRIN lens 37 can be integrated in the harmonic generator's input facet 29, making alignment relatively easy.

In FIG. 2, a polarizer P is introduced into the external resonant cavity between the laser diode's AR-coated output facet 23 and the harmonic generator's input facet 29. The external cavity is defined, as in FIG. 1, by the back facet reflector 25 of the laser diode 11 and the distributed Bragg reflector grating 27 at the front end 29 of the waveguide 31 of the harmonic generator 13. The polarizer P passes the TM polarization component of the light while blocking the TE polarization component. Thus, polarizer P introduces loss to the TE polarization mode of the external cavity. Feedback provided by the DBR grating 27 fabricated in the harmonic generator 13 will only enhance the TM mode of oscillation. Accordingly, the laser diode is made to operate in the TM mode, and the harmonic generator 13 need not be turned 90° onto its side to couple TM polarized light from the diode 11. Both the laser diode 11 and the entrance aperture of the waveguide 31 at the front facet 29 of the harmonic generator 13 can have a 3:1 aspect ratio and can be aligned for optimum mode matching with only simple beam collimating and focusing lens optics 39. For example, the waveguide 31 can have the same 3 μm wide and 1 μm deep dimensions as the beam waist of the light output from the output facet 23 of the laser diode 11.

Alternatively, the article by D. Welch et al. entitled "Low threshold current laser emitting at 637 nm" appearing in *Electronics Letters*, vol. 27, no. 9, pages 693–4 (1991) describes how to make a laser diode that operates with low threshold in a TM polarization mode, without the need for a polarizer, such as polarizer P in FIG. 2. The laser diode described in that article, incorporated by reference herein, may have its output light frequency-doubled using the arrangement shown in FIG. 1. Simple lens optics, like lenses 39 in FIGS. 2 and 3, that preserve the aspect ratio of the light emitted from the laser diode, could be used in such an arrangement.

With reference to FIG. 3, an alternative arrangement for coupling TM mode light into the harmonic generator 13 has a half-wave plate HW incorporated into the external cavity for rotating the polarization of the light beam. The polarization between the back facet reflector 25 of the laser diode 11 and the half-wave plate HW is the TE polarization mode, because the gain for the TE mode in the diode 11 is higher than the gain for the TM mode. Light emitted by the diode 11 is TM polarized upon passing through the half-wave plate HW. The polarization between the half-wave plate HW and the harmonic generator 13 is the TM polarization mode. Upon reflection by the DBR grating 27 in the harmonic generator 13, the reflected beam is still TM polarized until it passes through the half-wave plate HW. The half-wave plate HW rotates the polarization of the reflected light back into the TE polarization mode for coupling back into the laser diode 11. The result is a kind of "twisted" mode of oscillation that can use the high gain of the TE polarization in the laser diode 11, while coupling TM polarized light into the harmonic generator 13 for efficient frequency doubling. The 3:1 aspect ratio of the light output from the laser diode 11 is maintained by simple collimating and focusing lens optics 39, as in FIG. 2.

With reference to FIG. 5, for another way to force the laser diode 11 to operate in the TM polarization mode (like FIG. 2) is to set the polarization in the back portion of the resonant cavity. The back facet 25 of the laser diode 11 may be antireflection coated with a dielectric coating AR′, like front facet 23. A graded-index (GRIN) lens 41 may be butted against the AR′ coating of the back facet 25 in alignment with the active gain region of the laser diode 11. A polarization plate 43 is placed on one end of GRIN lens 41. The polarization plate 43 is coated with a high reflection coating HR. The polarizer plate 43 causes loss of TE polarized light, so that the TM mode of oscillation is favored by the cavity.

Figure 6:
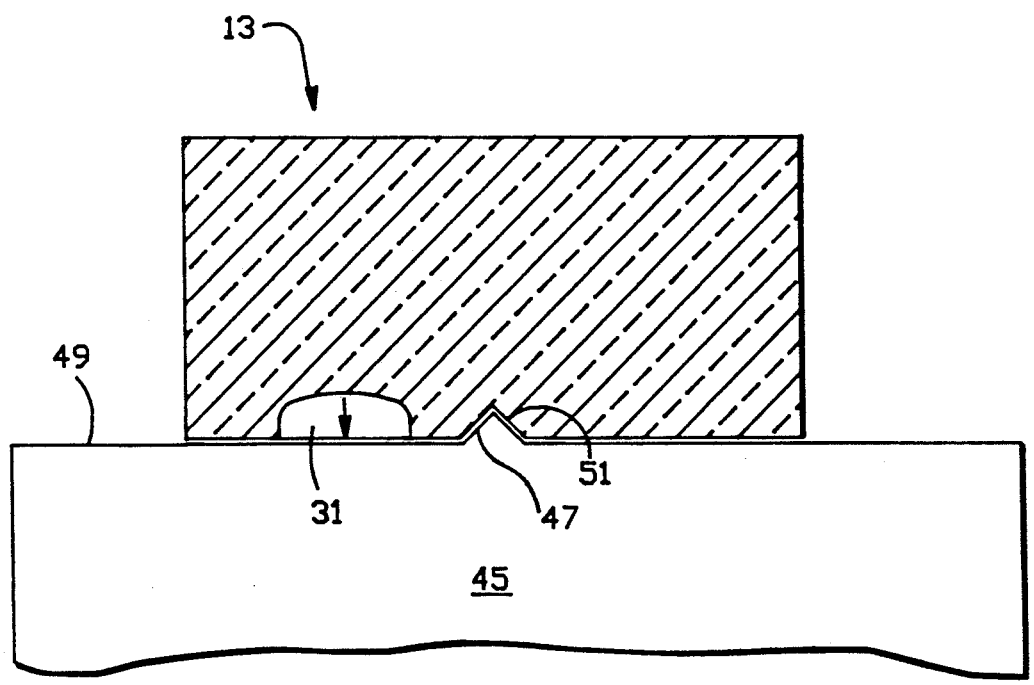
FIG. 6 is a front end view of the arrangement in FIG. 5 taken along the line 6—6 in FIG. 5.

In FIG. 5, the front portion of the cavity is assembled by butt coupling the laser diode 11 to the harmonic generator 13, such that the active gain region 17 of the laser diode 11 is aligned with the poled waveguide 31 of the harmonic generator 13. Reflectivity for the front end of the cavity is again provided by the DBR grating 27 fabricated on the surface of the harmonic generator 13. Butting the laser diode 11 and harmonic generator 13 against one another significantly relaxes the coupling procedure, because beam shaping, collimating or focusing lens optics like those seen in FIGS. 1–4 are not needed and only positional alignment need be considered. As seen in FIGS. 5 and 6, alignment marks may be used to correctly position the harmonic generator 13 relative to the laser diode 11. Both elements, for example, may be mounted on a common submount 45 that serves as a heat sink and support, as well as an electrical contact for the laser diode 11. A raised ridge 47 may be formed on the submount surface 49 by etching away side areas of the surface 49. This ridge 47 matches a groove 51 etched into the adjacent surfaces of the laser diode 11 and harmonic generator 13. Placing the groove 51 over the ridge 47 precisely aligns the active gain region 17 of the laser diode, both vertically and laterally, with the waveguide 31 formed in the top major surface of the harmonic generator 13. When mounting the harmonic generator 13 and laser diode 11 on a submount 45, they are best mounted with the active gain region 17 and waveguide 31 on the bottom, that top side down, as shown, so that differences in substrate thicknesses do not ruin the alignment. This alignment technique may be used whenever the exact dimensions of the waveguides in the system are known in advance.

Figure 7:
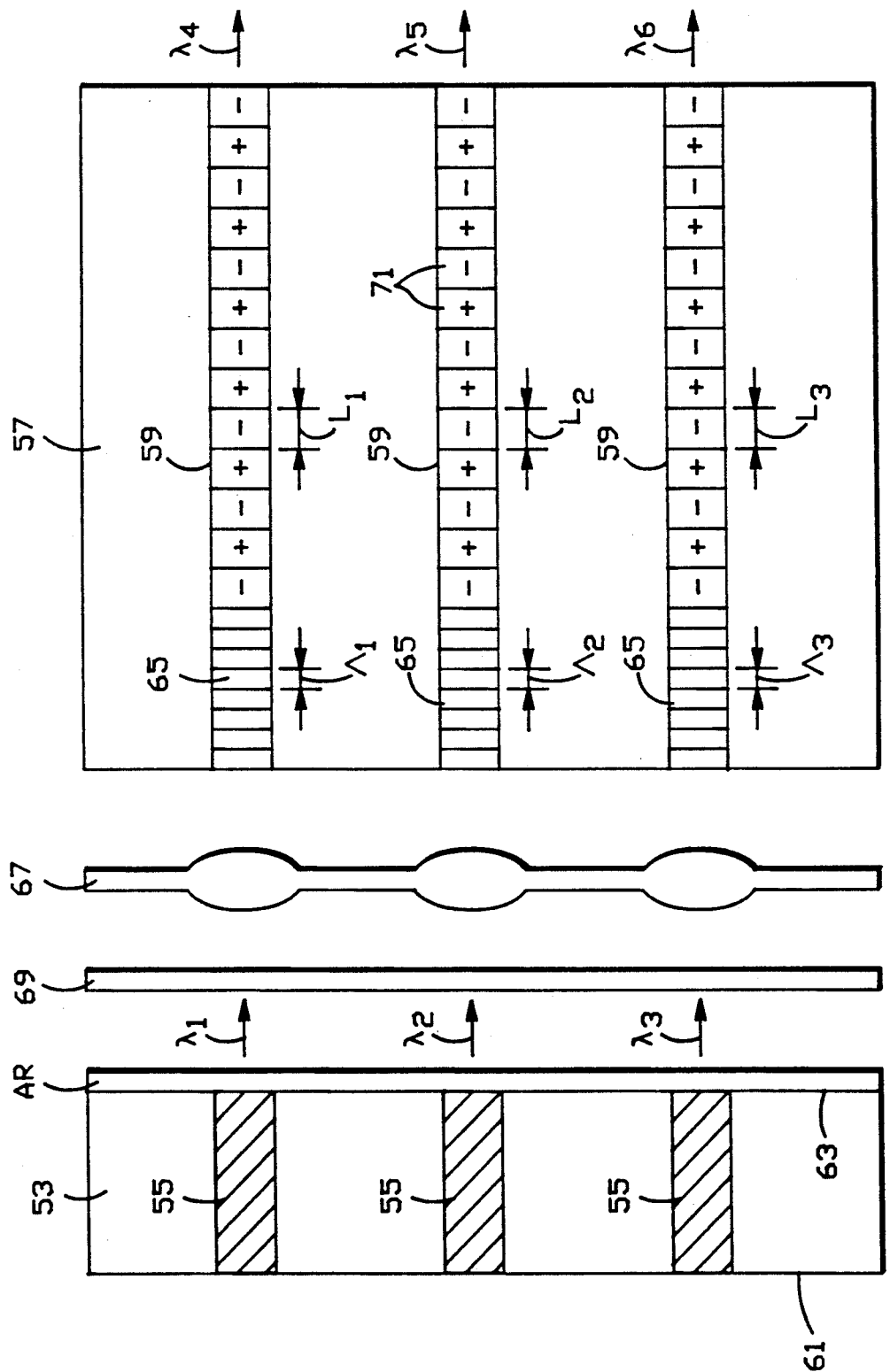
FIG. 7 is a top plan view of a fifth frequency-doubled diode laser arrangement.

With reference to FIG. 7, diode arrays may be coupled to arrays of waveguides of harmonic generators. A monolithic laser diode array 53 has a plurality of individual single-mode diode emitters, represented here by the plural stripe contacts 55 of a gain guided array, laterally spaced apart on a common substrate and generating multiple light outputs. A 50 μm center-to-center spacing is typical, but not essential. A harmonic generator 57, likewise, has a plurality of individual waveguides 59 with the same lateral spacing as the diode emitters for accepting each of the multiple light outputs from the diode array 53 and doubling the frequency of the accepted light. The waveguides 59 may be periodically poled. As in previous embodiments, the diode array 53 has a back cavity reflector 61, which may be the facet reflector shown, grating reflectors inside the array body or an external reflector like that seen in FIG. 5. The diode array 53 also has a low reflection or antireflection coating AR on its front facet 63. The waveguides 59 of the harmonic generator 57 have distributed Bragg reflector (DBR) gratings 65 for partially reflecting the fundamental lightwaves received from the diode array 53 back toward the diode array 53. Thus, a resonant optical cavity is defined by the back reflector 61 and the DBR gratings 65 for establishing lasing operation of the diode array 53. The DBR gratings 65 stabilize the light output from the individual diode emitters 55 at a wavelength or wavelengths defined by the pitch or pitches $\Lambda_1$, $\Lambda_2$, $\Lambda_3$, of the gratings 65. Coupling between the diode array 53 and harmonic generator 57 may be aided by beam shaping or beam collimating and focusing optics, such as a microlens array 67. Coupling of TM mode light into the waveguides 59 may be ensured with a polarizer or half-wave plate 69 in accord with the principles described above for FIGS. 2, 3 and 5.

The monolithic laser diode arrays 53 are well known in the art. The individual diode emitters 55 in the array 53 may produce multiple wavelengths, $\lambda_1$, $\lambda_2$ and $\lambda_3$ of light input, determined by the different grating pitches $\Lambda_1$, $\Lambda_2$ and $\Lambda_3$ of the DBR gratings 65 generator 57. One preferred type of multi-wavelength laser array that may be used is a terraced architecture set forth in U.S. Pat. Nos. 4,925,811, 4,955,030 and 5,037,627 to Menigaux et al., and incorporated by reference herein, with the addition of the antireflection coating AR to the front emitting surface 63. The polarization domains 71 in the harmonic generator may be made to have different selected lengths $L_1$, $L_2$ and $L_3$ corresponding to the differing coherence lengths of the second harmonic waves in the different waveguides 59, so as to provide the aforementioned birefringent phasematching, first-order quasi-phasematching or second-order quasi-phasematching at the desired wavelength. The result is a set of frequency-doubled light outputs of wavelengths $\lambda_4$, $\lambda_5$ and $\lambda_6$, corresponding to the fundamental light output wavelengths $\lambda_1$, $\lambda_2$ and $\lambda_3$ from the laser array 53.

We claim:
1. A frequency-converted diode laser comprising
   a ferroelectric harmonic generator having a electrically polarized waveguide for receiving light of a first frequency at an input end from a single spectral mode laser diode and emitting light of a second frequency at an output end thereof, said second frequency of light being a harmonic of said first frequency of light, said ferroelectric harmonic generator generating said light of said second frequency from said light of said first frequency; said ferroelectric harmonic generator also having a periodic reflector positioned along said waveguide and tuned to partially reflect light of said first frequency back toward and out of said input end, and a said single spectral mode laser diode optically coupled to said waveguide of said ferroelectric harmonic generator, said laser diode including active gain means for generating light of said first frequency, second cavity reflector associated with a back facet of said laser diode and a low reflection coated light emitting front facet through which light of said first frequency generated by said active gain means is directed toward said ferroelectric-harmonic generator, said periodic reflector in said ferroelectric-harmonic generator and said second cavity reflector associated with said back facet of said laser diode establishing a resonant optical cavity for light of said first frequency whereby feedback provided by said periodic reflector stabilizes the laser output to obtain efficient frequency conversion.

2. The laser of claim 1 wherein said first frequency selected by said periodic reflector matches the frequency of peak efficiency for conversion to said second frequency.

3. The laser of claim 1 wherein said periodic reflector is a DBR grating.

4. The laser of claim 1 wherein said waveguide of said harmonic generator is a periodically-poled waveguide with successive domains of alternating dominant electrical polarization states in the nonlinear material of said harmonic generator.

5. The laser of claim 4 wherein said domains form the periodic reflector.

6. The laser of claim 1 wherein said waveguide is a single transverse mode waveguide at said first frequency.

7. The laser of claim 1 wherein said second cavity reflector is a grating reflector formed in said laser diode proximate to said back facet.

8. The laser of claim 1 further comprising a polarizer positioned in said resonant optical cavity between said grating reflector in said harmonic generator and said second cavity reflector, said polarizer substantially blocking passage of a TE polarization component of light propagating in said cavity and substantially allowing passage of a TM polarization component of light propagating in said cavity, whereby TM mode operation of said laser diode is caused.

9. The laser of claim 8 wherein said polarizer is situated between said low reflection coated front facet of said laser diode and said input end of said harmonic generator.

10. The laser of claim 8 wherein said polarizer is situated between said back facet of said laser diode and said second cavity reflector, said second cavity reflector being external to said laser diode.

11. The laser of claim 1 wherein said laser diode operates in a TM polarization mode.

12. The laser of claim 1 further comprising a half-wave plate positioned between said low reflection coated front facet of said laser diode and said input end of said harmonic generator, said half-wave plate converting TE polarized light propagating in said laser diode to TM polarized light propagating in said harmonic generator, and converting TM polarized light reflected by said periodic reflector back into TE polarized light for feedback into said laser diode.

13. The laser diode of claim 1 wherein said harmonic generator is butted against said laser diode, with said waveguide of said harmonic generator positioned in alignment with said active gain means of said laser diode for accepting said light of said first frequency therefrom.

14. The laser of claim 1 further comprising optical means for coupling light between said active gain means of said laser diode and said waveguide of said harmonic generator.

15. The laser of claim 14 wherein said optical means includes a beam collimating and focusing lens system positioned between said low reflection coated front facet of said laser diode and said input end of said harmonic generator.

16. The laser of claim 14 wherein said waveguide has an aspect ratio for light accepted thereby and, upon feedback, radiated therefrom which matches an aspect ratio for light radiated by said active gain means and, upon feedback, accepted thereby.

17. The laser of claim 14 wherein said optical means includes beam shaping means for converting light with a first aspect ratio corresponding to said active gain means of said laser diode to a second aspect ratio corresponding to said waveguide of said harmonic generator.

18. The laser of claim 17 wherein said beam shaping means includes a cylindrical fiber lens positioned immediately in front of said antireflection coated front facet of said laser diode.

19. The laser of claim 1 wherein said laser diode and harmonic generator are mounted on a common base, said base having means for positionally aligning said laser diode with said harmonic generator for optical coupling therebetween.

20. The laser of claim 19 wherein said aligning means comprises a mutually engaging ridge and groove combination formed in a top surface of said base and adjacent surfaces of said laser diode and said harmonic generator.

21. The laser of claim 1 wherein said laser diode has an array of laterally spaced diode emitters, said harmonic generator having plural waveguides laterally spaced to each receive light from a corresponding one of said diode emitters, each waveguide having a periodic reflector capable of reflecting a portion of the light received from said diode emitters back into said diode emitters, each waveguide emitting light at an output end thereof with a frequency double that of the light received from its corresponding diode emitter.

22. The laser of claim 21 wherein said laser diode is a multi-wavelength laser diode array with each diode emitter providing light to said corresponding waveguide with a wavelength determined by said periodic reflector in said waveguide.

* * * * *